(12) United States Patent
Sun et al.

(10) Patent No.: US 10,637,374 B2
(45) Date of Patent: Apr. 28, 2020

(54) MAGNETIC SENSOR INTEGRATED CIRCUIT, MOTOR COMPONENT AND APPLICATION APPARATUS

(71) Applicant: JOHNSON ELECTRIC INTERNATIONAL AG, Murten (CH)

(72) Inventors: Chi Ping Sun, Hong Kong (CN); Fei Xin, Shen Zhen (CN); Ken Wong, Hong Kong (CN); Shing Hin Yeung, Hong Kong (CN); Shu Juan Huang, Shen Zhen (CN); Yun Long Jiang, Shen Zhen (CN); Yue Li, Hong Kong (CN); Bao Ting Liu, Shen Zhen (CN); En Hui Wang, Shen Zhen (CN); Xiu Wen Yang, Shen Zhen (CN); Li Sheng Liu, Shen Zhen (CN); Yan Yun Cui, Shen Zhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 25 days.

(21) Appl. No.: 15/230,917

(22) Filed: Aug. 8, 2016

(65) Prior Publication Data

US 2016/0344315 A1 Nov. 24, 2016

Related U.S. Application Data

(63) Continuation-in-part of application No. 14/822,353, filed on Aug. 10, 2015, now Pat. No. 9,755,555, (Continued)

(30) Foreign Application Priority Data

Aug. 8, 2014 (CN) .......................... 2014 1 0390592
Aug. 15, 2014 (CN) .......................... 2014 1 0404474

(Continued)

(51) Int. Cl.
*H02M 1/42* (2007.01)
*H02P 29/032* (2016.01)
(Continued)

(52) U.S. Cl.
CPC ................ *H02P 6/16* (2013.01); *G01R 33/07* (2013.01); *H02K 11/215* (2016.01); *H02P 6/20* (2013.01);
(Continued)

(58) Field of Classification Search
CPC ...... H02M 1/4225; H02P 29/032; H02P 6/16; H02K 3/28
See application file for complete search history.

(56) References Cited

U.S. PATENT DOCUMENTS 5,675,226 A 10/1997 Riola'
6,097,127 A * 8/2000 Rivera .................... H02K 3/28
310/184

(Continued)

FOREIGN PATENT DOCUMENTS

CN 201409107 Y 2/2010
CN 201590796 U 9/2010
(Continued)

*Primary Examiner* — Cortez M Cook
(74) *Attorney, Agent, or Firm* — Muncy, Geissler, Olds & Lowe, P.C.

(57) ABSTRACT

A magnetic sensor integrated circuit, a motor component and an application apparatus are provided. The integrated circuit includes: an input port, an output port, a magnetic field detection circuit and an output control circuit. The magnetic field detection circuit detects an external magnetic field and outputs magnetic field detection information. The output control circuit enables, at least based on the magnetic field detection information, the integrated circuit to switch at least between a first state, in which a current flows from the output port to an outside of the integrated circuit, and a (Continued)

second state, in which a current flows from the outside of the integrated circuit to the output port.

20 Claims, 11 Drawing Sheets

Related U.S. Application Data which is a continuation-in-part of application No. PCT/CN2015/086422, filed on Aug. 7, 2015.

(30) Foreign Application Priority Data

| | | |
|---|---|---|
| Apr. 1, 2016 | (CN) | 2016 1 0203681 |
| Jun. 2, 2016 | (CN) | 2016 1 0390049 |

(51) Int. Cl.

| | |
|---|---|
| *H02K 3/28* | (2006.01) |
| *H02P 6/16* | (2016.01) |
| *H02P 6/20* | (2016.01) |
| *H02K 11/215* | (2016.01) |
| *G01R 33/07* | (2006.01) |
| *H02P 7/03* | (2016.01) |
| *H02P 6/30* | (2016.01) |
| *H02P 7/295* | (2016.01) |

(52) U.S. Cl.
CPC ............... *H02P 6/30* (2016.02); *H02P 7/05* (2016.02); *H02P 7/295* (2013.01); *H02P 2207/05* (2013.01)

(56) References Cited

U.S. PATENT DOCUMENTS

| | | | |
|---|---|---|---|
| 7,173,388 B1* | 2/2007 | Hsu | H02P 29/032 318/400.21 |
| 2003/0210006 A1* | 11/2003 | Kusaka | H02P 1/46 318/437 |
| 2007/0271915 A1* | 11/2007 | Safran | F03G 7/06 60/531 |
| 2012/0086382 A1* | 4/2012 | Peto | H02M 1/4225 318/729 |

FOREIGN PATENT DOCUMENTS

| | | |
|---|---|---|
| CN | 102075130 A | 5/2011 |
| DE | 102006055482 A1 | 6/2008 |

\* cited by examiner

MAGNETIC SENSOR INTEGRATED CIRCUIT, MOTOR COMPONENT AND APPLICATION APPARATUS

CROSS REFERENCE TO RELATED APPLICATIONS

This non-provisional patent application is a continuation-in-part of U.S. patent application Ser. No. 14/822,353, which claims priority to Chinese Patent Application No. 201410390592.2, filed on Aug. 8, 2014 and to Chinese Patent Application No. 201410404474.2, filed on Aug. 15, 2014. In addition, this non-provisional patent application claims priority under the Paris Convention to PCT Patent Application No. PCT/CN2015/086422, filed with the Chinese Patent Office on Aug. 7, 2015, to Chinese Patent Application No. CN201610203681.0, filed with the Chinese Patent Office on Apr. 1, 2016, and to Chinese Patent Application No. CN201610390049.1, filed with the Chinese Patent Office on Jun. 2, 2016, all of which are incorporated herein by reference in their entirety.

FIELD

The disclosure relates to the field of magnetic field detection technology.

BACKGROUND

During starting of a synchronous motor, the stator produces an alternating magnetic field causing the permanent magnetic rotor to be oscillated. The amplitude of the oscillation of the rotor increases until the rotor begins to rotate, and finally the rotor is accelerated to rotate in synchronism with the alternating magnetic field of the stator. To ensure the starting of a conventional synchronous motor, a starting point of the motor is set to be low, which results in that the motor cannot operate at a relatively high working point, thus the efficiency is low. In another aspect, the rotor cannot be ensured to rotate in a same direction every time since a stop or stationary position of the permanent magnetic rotor is not fixed. Accordingly, in applications such as a fan and water pump, the impeller driven by the rotor has straight radial vanes, which results in a low operational efficiency of the fan and water pump.

FIG. 1 illustrates a conventional drive circuit for a synchronous motor, which allows a rotor to rotate in a same predetermined direction in every time it starts. In the circuit, a stator winding 1 of the motor is connected in series with a TRIAC between two terminals M and N of an AC power source VM, and an AC power source VM is converted by a conversion circuit DC into a direct current voltage and the direct current is supplied to a position sensor H. A magnetic pole position of a rotor in the motor is detected by the position sensor H, and an output signal Vh of the position sensor H is connected to a switch control circuit PC to control the bidirectional thyristor T.

FIG. 2 illustrates a waveform of the drive circuit. It can be seen from FIG. 2 that, in the drive circuit, no matter the bidirectional thyristor T is switched on or off, the AC power source supplies power for the conversion circuit DC so that the conversion circuit DC constantly outputs and supplies power for the position sensor H (referring to a signal VH in FIG. 2). In a low-power application, in a case that the AC power source is commercial electricity of about 200V, the electric energy consumed by two resistors R2 and R3 in the conversion circuit DC is more than the electric energy consumed by the motor.

The magnetic sensor applies Hall effect, in which, when current I runs through a substance and a magnetic field B is applied in a positive angle with respect to the current I, a potential difference V is generated in a direction perpendicular to the direction of current I and the direction of the magnetic field B. The magnetic sensor is often implemented to detect the magnetic polarity of an electric rotor.

As the circuit design and signal processing technology advances, there is a need to improve the magnetic sensor integrated circuit for the ease of use and accurate detection.

SUMMARY

In one aspect, a magnetic sensor integrated circuit is provided according to embodiments of the present disclosure. The magnetic sensor integrated circuit includes:

at least one input port and an output port;

a magnetic field detection circuit configured to detect an external magnetic field and output magnetic field detection information accordingly; and an output control circuit configured to enable, at least based on the magnetic field detection information, the integrated circuit to switch at least between a first state in which a current flows from the output port to an outside of the integrated circuit, and a second state in which a current flows from the outside of the integrated circuit to the output port.

Preferably, the magnetic field detection circuit may be powered by a first power supply, and the output control circuit may be powered by a second power supply different from the first power supply.

Preferably, the second power supply may be a power supply with a variable amplitude.

Preferably, the first power supply may be a direct current power supply with a constant amplitude.

Preferably, an average value of an output voltage of the first power supply is less than an average value of an output voltage of the second power supply.

Preferably, the at least one input port may include an input port configured to connect an external alternating current power supply, and the output control circuit is configured to enable, based on a polarity of the alternating current power supply and the magnetic field detection information, the integrated circuit to switch at least between the first state and the second state.

Preferably, the output control circuit include a first switch and a second switch, the first switch and the output port being connected in a first current path, the second switch and the output port being connected in a second current path having a direction reverse to a direction of the first current path, and the first switch and the second switch being selectively turned on under control of the magnetic field detection information.

Preferably, the first switch is a triode, and the second switch is a diode or a triode.

Preferably, the output control circuit comprises a first current path in which a current flows out from the output port, a second current path in which a current flows in from the output port, and a switch connected in one of the first current path and the second current path, wherein the switch is controlled by the magnetic field detection information outputted by the magnetic field detection circuit, and allows the first current path and the second current path to be selectively turned on.

Preferably, no switch is provided in the other one of the first current path and the second current path.

Preferably, the output control circuit is configured to control the output port to have a load current flowing through in a case that the alternating current power supply is in a positive half-cycle and a polarity of an external magnetic field detected by the magnetic field detection circuit is a first polarity, or in a case that the alternating current power supply is in a negative half-cycle and the polarity of the external magnetic field detected by the magnetic field detection circuit is a second polarity reverse to the first polarity, and is configured to control the output port to have no load current flowing through in a case that the alternating current power supply is in a positive half-cycle and the polarity of the external magnetic field is the second polarity, or in a case that the alternating current power supply is in a negative half-cycle and the polarity of the external magnetic field is the first polarity.

Preferably, the magnetic field detection circuit has a same power supply as the output control circuit.

Preferably, the at least one input port includes a first input port and a second input port configured to connect an external alternating current power supply, and the integrated circuit further comprises a rectifying circuit configured to convert an alternating current outputted by the external alternating current power supply into a direct current.

Preferably, the integrated circuit further includes a voltage regulator circuit configured to regulate a first voltage outputted by the rectifying circuit to a second voltage, wherein the second voltage is supplied to the magnetic field detection circuit, the first voltage is supplied to the output control circuit, and an average value of the first voltage is greater than an average value of the second voltage.

Preferably, the magnetic field detection circuit includes:

a magnetic field detection element configured to detect the external magnetic field and generate an electric signal;

a signal processing unit configured to amplify and descramble the electric signal; and an analog-digital converting unit configured to convert the amplified and descrambled electric signal into the magnetic field detection information which is a switch-type digital signal.

Preferably, the input port may include a first input port and a second input port both of which are configured to connect an external alternating current power supply, and frequencies of occurrence of the first state or the second state is proportional to a frequency of the alternating current power supply.

In another aspect, a motor component is provided. The motor component includes a motor and a motor drive circuit, and the motor drive circuit includes a magnetic sensor integrated circuit mentioned above.

Preferably, the motor drive circuit further includes a bidirectional switch in series with the motor between two terminals of an external alternating current power supply, and the output port of the magnetic sensor integrated circuit is connected to a control terminal of the bidirectional switch.

Preferably, the motor includes a stator and a permanent magnet rotor, and the stator includes a stator core and a single-phase winding wound on the stator core.

Preferably, the motor component further includes a buck regulator configured to lower a voltage of the alternating current power supply and provide the lowered voltage to the magnetic sensor integrated circuit.

Preferably, the output control circuit is configured to turn on the bidirectional switch in a case that the alternating current power supply is in a positive half-cycle and a polarity of magnetic field of the permanent magnet rotor detected by the magnetic field detection circuit is a first polarity, or in a case that the alternating current power supply is in a negative half-cycle and the polarity of magnetic field of the permanent magnet rotor detected by the magnetic field detection circuit is a second polarity reverse to the first polarity, and is configured to turn off the bidirectional switch in a case that the alternating current power supply is in a negative half-cycle and the polarity of magnetic field of the permanent magnet rotor is the first polarity, or in a case that the alternating current power supply is in a positive half-cycle and the polarity of magnetic field of the permanent magnet rotor is the second polarity.

Preferably, the output control circuit is configured to control a current to flow from the integrated circuit to the bidirectional switch in a case that a signal outputted by the alternating current power supply is in a positive half-cycle and the polarity of magnetic field of the permanent magnet rotor detected by the magnetic field detection circuit is the first polarity, and control a current to flow from the bidirectional switch to the integrated circuit in a case that the signal outputted by the alternating current power supply is in a negative half-cycle and the polarity of magnetic field of the permanent magnet rotor detected by the magnetic field detection circuit is the second polarity reverse to the first polarity.

In still another aspect, an application apparatus including a motor component mentioned above is provided.

Preferably, the application apparatus is a pump, a fan, a household appliance or a vehicle.

This magnetic sensor integrated circuit according to the embodiments of the disclosure extends a function of the existing magnetic sensor, thereby reducing the overall cost for the circuit and improving the reliability of the circuit.

BRIEF DESCRIPTION OF THE DRAWINGS

The drawings to be used in the description of embodiments of the disclosure or the conventional technology are described briefly as follows, so that technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

Technical solutions according to embodiments of the present disclosure are described clearly and completely in conjunction with the drawings in the embodiments of the present disclosure hereinafter. Apparently, the described embodiments are only a few rather than all of the embodiments of the present disclosure. Other embodiments obtained by those skilled in the art without any creative work based on the embodiments of the present disclosure fall into the scope of protection of the present disclosure.

More specific details are set forth in the following descriptions for sufficient understanding of the disclosure, but the present disclosure may further be implemented by other ways different from the way described herein. Similar extensions can be made by those skilled in the art without departing from the spirit of the present disclosure, and therefore, the present disclosure is not limited to particular embodiments disclosed hereinafter.

Figure 1:
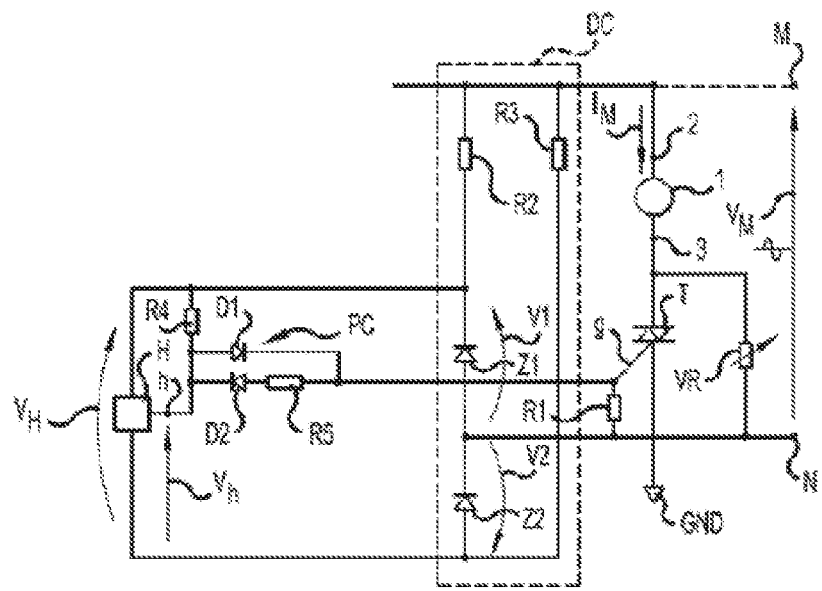
FIG. 1 illustrates a prior art drive circuit for a synchronous motor, according to an embodiment of the present disclosure.
Figure 2:
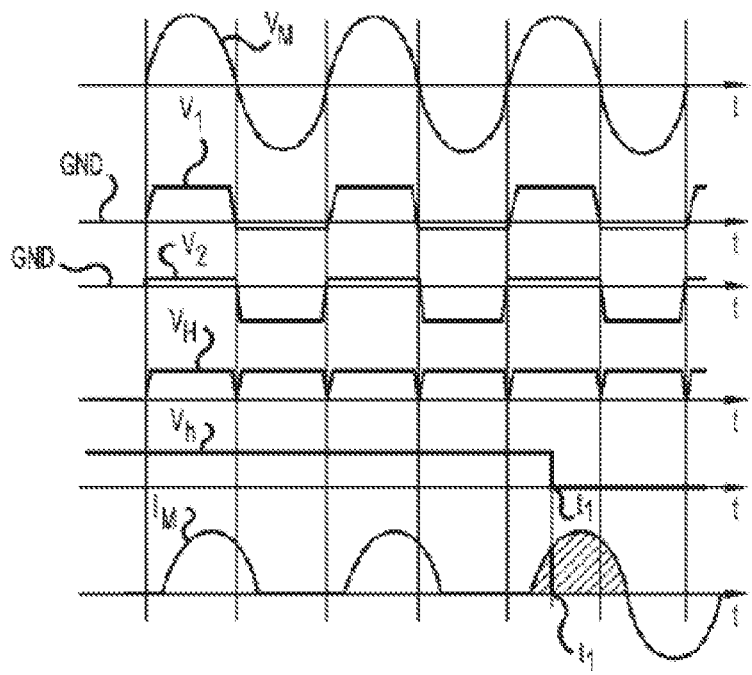
FIG. 2 illustrates a waveform of the drive circuit shown in FIG. 1.
Figure 3:
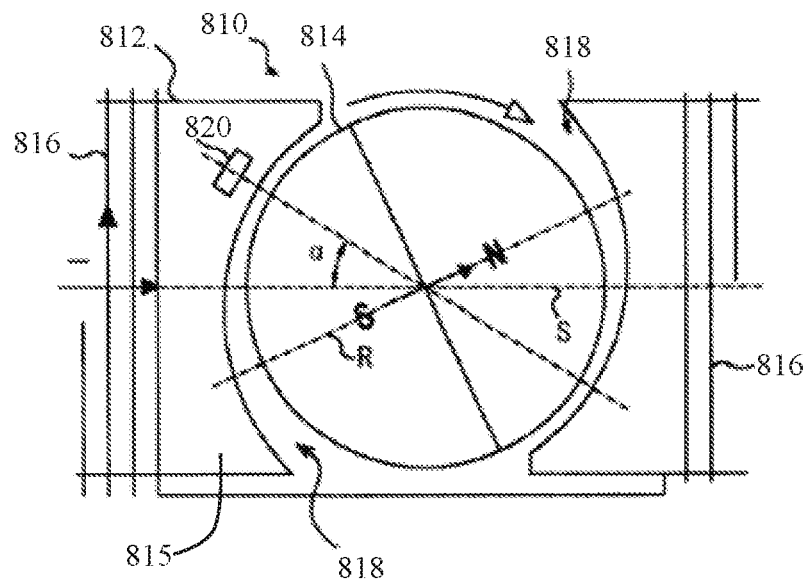
FIG. 3 illustrates a diagrammatic representation of a synchronous motor, according to an embodiment of the present disclosure.

FIG. 3 schematically shows a synchronous motor according to an embodiment of the present invention. The synchronous motor 810 includes a stator 812 and a permanent magnet rotor 814 rotatably disposed between magnetic poles of the stator 812, and the stator 812 includes a stator core 815 and a stator winding 816 wound on the stator core 815. The rotor 814 includes at least one permanent magnet forming at least one pair of permanent magnetic poles with opposite polarities, and the rotor 814 operates at a constant rotational speed of 60 f/p rpm during a steady state phase in a case that the stator winding 816 is connected to an AC power supply, where f is a frequency of the AC power supply and p is the number of pole pairs of the rotor.

Non-uniform gap 818 is formed between the magnetic poles of the stator 812 and the permanent magnetic poles of the rotor 814 so that a polar axis R of the rotor 814 has an angular offset a relative to a central axis S of the stator 812 in a case that the rotor is at rest. The rotor 814 may be configured to have a fixed starting direction (a clockwise direction in this embodiment as shown by the arrow in FIG. 3) every time the stator winding 816 is energized. The stator and the rotor each have two magnetic poles as shown in FIG. 3. It can be understood that, in other embodiments, the stator and the rotor may also have more magnetic poles, such as 4 or 6 magnetic poles.

A position sensor 820 for detecting the angular position of the rotor is disposed on the stator 812 or at a position near the rotor inside the stator, and the position sensor 820 has an angular offset relative to the central axis S of the stator. Preferably, this angular offset is also a, as in this embodiment. Preferably, the position sensor 820 is a Hall effect sensor.

Figure 4:
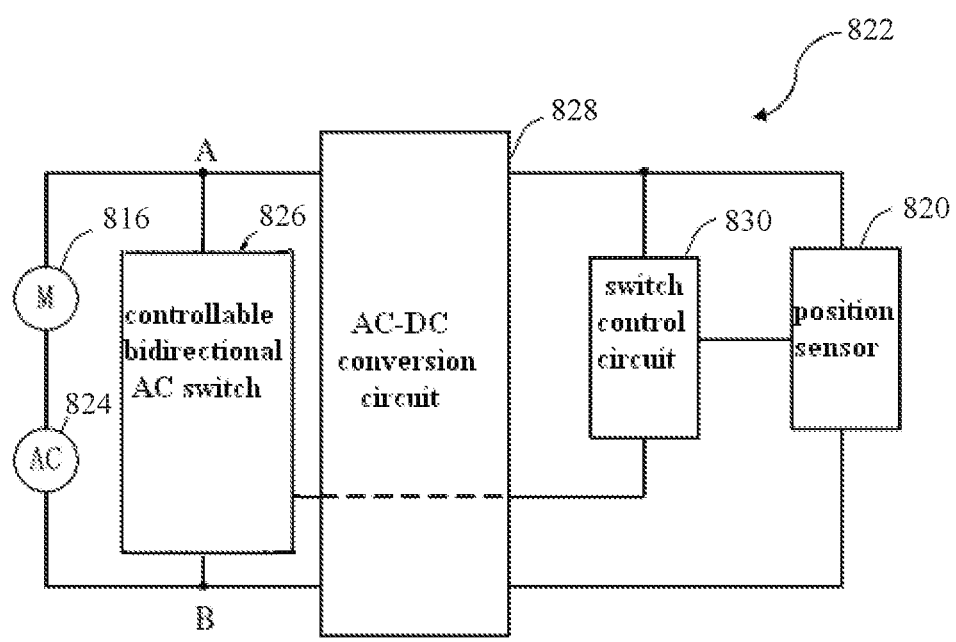
FIG. 4 illustrates a block diagram of a drive circuit for a synchronous motor, according to an embodiment of the present disclosure.

FIG. 4 shows a block diagram of a drive circuit for a synchronous motor according to an embodiment of the present invention. In the drive circuit 822, the stator winding 816 and the AC power supply 824 are connected in series between two nodes A and B.

Preferably, the AC power supply 824 may be a commercial AC power supply with a fixed frequency, such as 50 Hz or 60 Hz, and a supply voltage may be, for example, 110V, 220V or 230V. A controllable bidirectional AC switch 826 is connected between the two nodes A and B, in parallel with the stator winding 816 and the AC power supply 824. Preferably, the controllable bidirectional AC switch 826 is a TRIAC, of which two anodes are connected to the two nodes A and B respectively. It can be understood that, the controllable bidirectional AC switch 826 alternatively may be two silicon control rectifiers reversely connected in parallel, and control circuits may be correspondingly configured to control the two silicon control rectifiers in a preset way. An AC-DC conversion circuit 828 is also connected between the two nodes A and B. An AC voltage between the two nodes A and B is converted by the AC-DC conversion circuit 828 into a low voltage DC. The position sensor 820 may be powered by the low voltage DC output by the AC-DC conversion circuit 828, for detecting the magnetic pole position of the permanent magnet rotor 814 of the synchronous motor 810 and outputting a corresponding signal. A switch control circuit 830 is connected to the AC-DC conversion circuit 828, the position sensor 820 and the controllable bidirectional AC switch 826, and is configured to control the controllable bidirectional AC switch 826 to be switched between a switch-on state and a switch-off state in a predetermined way, based on the magnetic pole position of the permanent magnet rotor which is detected by the position sensor and polarity information of the AC power supply 824 which may be obtained from the AC-DC conversion circuit 828, such that the stator winding 816 urges the rotor 814 to rotate only in the above-mentioned fixed starting direction during a starting phase of the motor. According to this embodiment of the present invention, in a case that the controllable bidirectional AC switch 826 is switched on, the two nodes A and B are shorted, the AC-DC conversion circuit 828 does not consume electric energy since there is no current flowing through the AC-DC conversion circuit 828, hence, the utilization efficiency of electric energy can be improved significantly.

Figure 5:
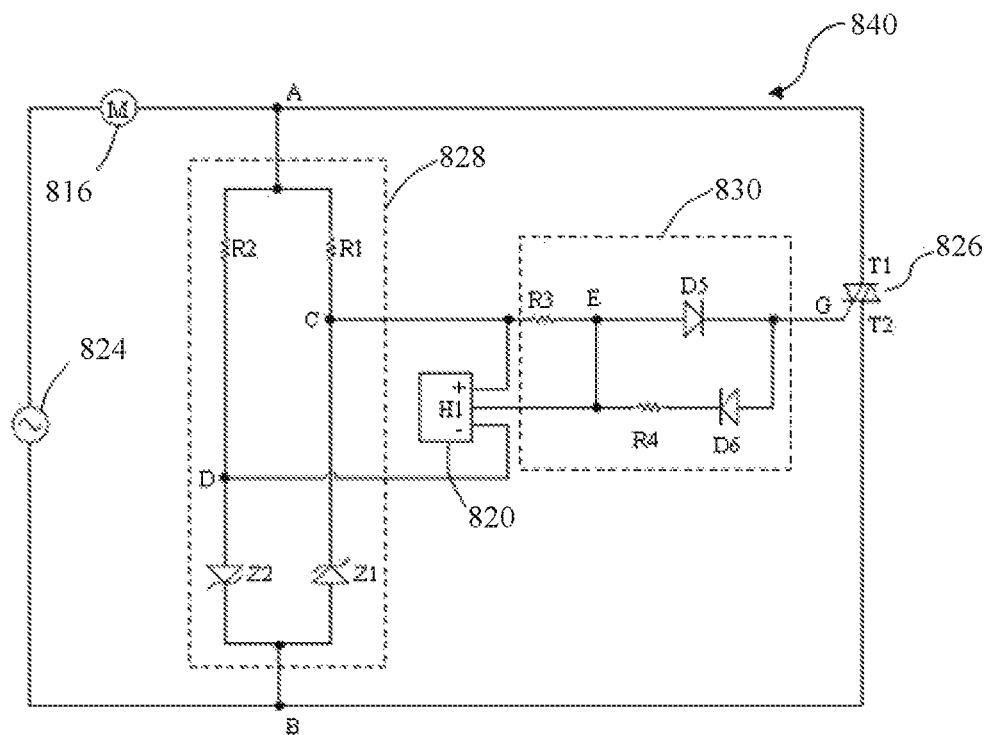
FIG. 5 illustrates a drive circuit for a synchronous motor, according to an embodiment of the present disclosure.

FIG. 5 shows a circuit diagram of a drive circuit 840 for a synchronous motor according to a first embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC (preferably, low voltage ranges from 3V to 18V). The AC-DC conversion circuit 828 includes a first zener diode Z1 and a second zener diode Z2 which are reversely connected in parallel between the two nodes A and B via a first resistor R1 and a second resistor R2 respectively. A high voltage output terminal C of the AC-DC conversion circuit 828 is formed at a connection point of the first resistor R1 and a cathode of the first zener diode Z1, and a low voltage output terminal D of the AC-DC conversion circuit 828 is formed at a connection point of the second resistor R2 and an anode of the second zener diode Z2. The voltage output terminal C is connected to a positive power supply terminal of the position sensor 820, and the voltage output terminal D is connected to a negative power supply terminal of the position sensor 820. Three terminals of the switch control circuit 830 are connected to the high voltage output terminal C of the AC-DC conversion circuit 828, an output terminal H1 of the position sensor 820 and a control electrode G of the TRIAC 826 respectively. The switch control circuit 830 includes a third resistor R3, a fifth diode D5, and a fourth resistor R4 and a sixth diode D6 connected in series between the output terminal HI of the position sensor 820 and the control electrode G of the controllable bidirectional AC switch 826. An anode of the sixth diode D6 is connected to the control electrode G of the controllable bidirectional AC switch 826. One terminal of the third resistor R3 is connected to the high voltage output terminal C of the AC-DC conversion circuit 828, and the other terminal of the third resistor R3 is connected to an anode of the fifth diode D5. A cathode of the fifth diode D5 is connected to the control electrode G of the controllable bidirectional AC switch 826.

Figure 6:
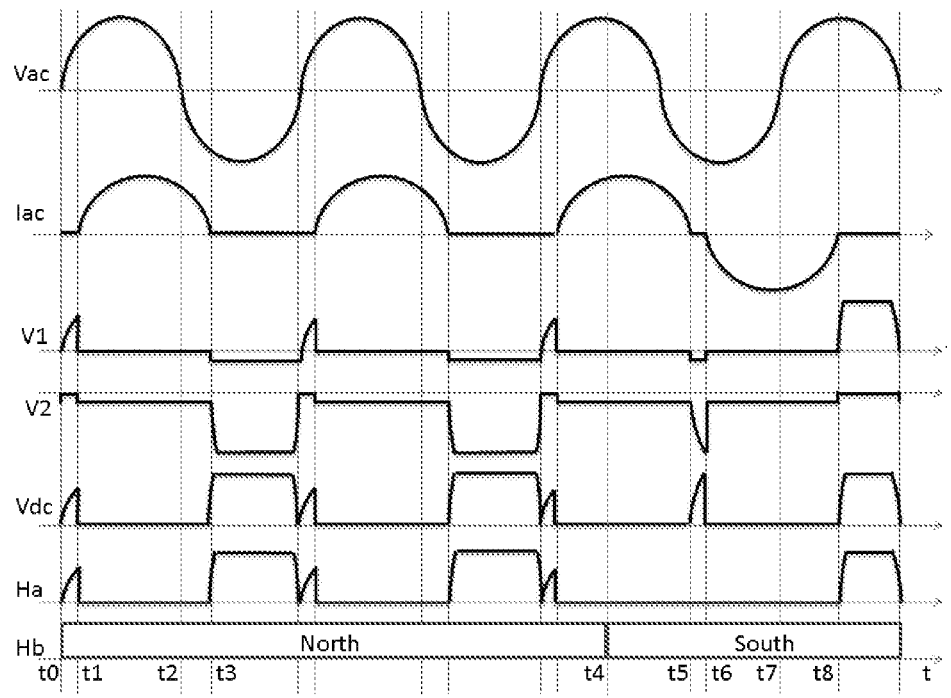
FIG. 6 illustrates a waveform of the drive circuit shown in FIG. 5.

In conjunction with FIG. 6, an operational principle of the drive circuit 840 is described. In FIG. 6, Vac indicates a waveform of voltage of the AC power supply 824, and Iac indicates a waveform of current flowing through the stator winding 816. Due to the inductive character of the stator winding 816, the waveform of current Iac lags behind the waveform of voltage Vac. V1 indicates a waveform of voltage between two terminals of the first zener diode Z1, V2 indicates a waveform of voltage between two terminals of the second zener diode Z2, Vdc indicates a waveform of voltage between two output terminals C and D of the AC-DC conversion circuit 828, Ha indicates a waveform of a signal output by the output terminal H1 of the position sensor 820, and Hb indicates a rotor magnetic field detected by the position sensor 820. In this embodiment, in a case that the position sensor 820 is powered normally, the output terminal H1 outputs a logic high level in a case that the detected rotor magnetic field is North, or the output terminal H1 outputs a logic low level in a case that the detected rotor magnetic field is South.

In a case that the rotor magnetic field Hb detected by the position sensor 820 is North, in a first positive half cycle of the AC power supply, the supply voltage is gradually increased from a time instant t0 to a time instant t1, the output terminal H1 of the position sensor 820 outputs a high level, and a current flows through the resistor R1, the resistor R3, the diode D5 and the control electrode G and the second anode T2 of the TRIAC 826 sequentially. The TRIAC 826 is switched on in a case that a drive current flowing through the control electrode G and the second anode T2 is greater than a gate triggering current Ig. Once the TRIAC 826 is switched on, the two nodes A and B are shorted, a current flowing through the stator winding 816 in the motor is gradually increased until a large forward current flows through the stator winding 816 to drive the rotor 814 to rotate clockwise as shown in FIG. 3. Since the two nodes A and B are shorted, there is no current flowing through the AC-DC conversion circuit 28 from the time instant t1 to a time instant t2. Hence, the resistors R1 and R2 do not consume electric energy, and the output of the position sensor 820 is stopped due to no power is supplied. Since the current flowing through two anodes T1 and T2 of the TRIAC 826 is large enough (which is greater than a holding current Ihold), the TRIAC 826 is kept to be switched on in a case that there is no drive current flowing through the control electrode G and the second anode T2. In a negative half cycle of the AC power supply, after a time instant t3, a current flowing through T1 and T2 is less than the holding current Ihold, the TRIAC 826 is switched off, a current begins to flow through the AC-DC conversion circuit 828, and the output terminal HI of the position sensor 820 outputs a high level again. Since a potential at the point C is lower than a potential at the point E, there is no drive current flowing through the control electrode G and the second anode T2 of the TRIAC 826, and the TRIAC 826 is kept to be switched off. Since the resistance of the resistors R1 and R2 in the AC-DC conversion circuit 828 are far greater than the resistance of the stator winding 816 in the motor, a current currently flowing through the stator winding 816 is far less than the current flowing through the stator winding 816 from the time instant t1 to the time instant t2 and generates very small driving force for the rotor 814. Hence, the rotor 814 continues to rotate clockwise due to inertia. In a second positive half cycle of the AC power supply, similar to the first positive half cycle, a current flows through the resistor R1, the resistor R3, the diode D5, and the control electrode G and the second anode T2 of the TRIAC 826 sequentially. The TRIAC 826 is switched on again, and the current flowing through the stator winding 816 continues to drive the rotor 814 to rotate clockwise. Similarly, the resistors R1 and R2 do not consume electric energy since the two nodes A and B are shorted. In the next negative half cycle of the power supply, the current flowing through the two anodes T1 and T2 of the TRIAC 826 is less than the holding current Ihold, the TRIAC 826 is switched off again, and the rotor continues to rotate clockwise due to the effect of inertia.

At a time instant t4, the rotor magnetic field Hb detected by the position sensor 820 changes to be South from North, the AC power supply is still in the positive half cycle and the TRIAC 826 is switched on, the two nodes A and B are shorted, and there is no current flowing through the AC-DC conversion circuit 828. After the AC power supply enters the negative half cycle, the current flowing through the two anodes T1 and T2 of the TRIAC 826 is gradually decreased, and the TRIAC 826 is switched off at a time instant t5. Then the current flows through the second anode T2 and the control electrode G of the TRIAC 826, the diode D6, the resistor R4, the position sensor 820, the resistor R2 and the stator winding 816 sequentially. As the drive current is gradually increased, the TRIAC 826 is switched on again at a time instant t6, the two nodes A and B are shorted again, the resistors RI and R2 do not consume electric energy, and the output of the position sensor 820 is stopped due to no power is supplied. There is a larger reverse current flowing through the stator winding 816, and the rotor 814 continues to be driven clockwise since the rotor magnetic field is South. From the time instant t5 to the time instant t6, the first zener diode Z1 and the second zener diode Z2 are switched on, hence, there is a voltage output between the two output terminals C and D of the AC-DC conversion circuit 828. At a time instant t7, the AC power supply enters the positive half cycle again, the TRIAC 826 is switched off when the current flowing through the TRIAC 826 crosses zero, and then a voltage of the control circuit is gradually increased. As the voltage is gradually increased, a current begins to flow through the AC-DC conversion circuit 828, the output terminal H1 of the position sensor 820 outputs a low level, there is no drive current flowing through the control electrode G and the second anode T2 of the TRIAC 826, hence, the TRIAC 826 is switched off. Since the current flowing through the stator winding 816 is very small, nearly no driving force is generated for the rotor 814. At a time instant t8, the power supply is in the positive half cycle, the position sensor outputs a low level, the TRIAC 826 is kept to be switched off after the current crosses zero, and the rotor continues to rotate clockwise due to inertia. According to an embodiment of the present invention, the rotor may be accelerated to be synchronized with the stator after rotating only one circle after the stator winding is energized.

In the embodiment of the present invention, by taking advantage of a feature of a TRIAC that the TRIAC is kept to be switched on although there is no drive current flowing though the TRIAC once the TRIAC is switched on, it is avoided that a resistor in the AC-DC conversion circuit still consumes electric energy after the TRIAC is switched on, hence, the utilization efficiency of electric energy can be improved significantly.

Figure 7:
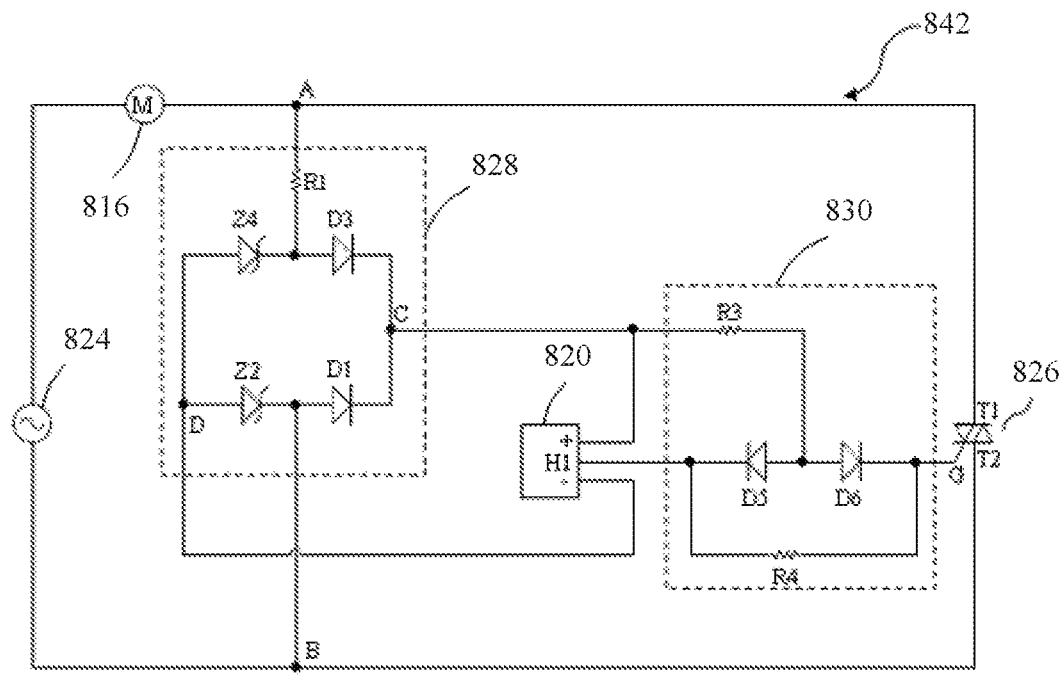
FIGS. 7 to 10 illustrate different embodiments of a drive circuit of a synchronous motor, according to an embodiment of the present disclosure.

FIG. 7 shows a circuit diagram of a drive circuit 842 for a synchronous motor according to an embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes a first diode D1 and a third diode D3 reversely connected in series, and the other of the two rectifier branches includes a second zener diode Z2 and a fourth zener diode Z4 reversely connected in series, the high voltage output terminal C of the AC-DC conversion circuit 828 is formed at a connection point of a cathode of the first diode D1 and a cathode of the third diode D3, and the low voltage output terminal D of the AC-DC conversion circuit 828 is formed at a connection point of an anode of the second zener diode Z2 and an anode of the fourth zener diode Z4. The output terminal C is connected to a positive power supply terminal of the position sensor 820, and the output terminal D is connected to a negative power supply terminal of the position sensor 820. The switch control circuit 30 includes a third resistor R3, a fourth resistor R4, and a fifth diode D5 and a sixth diode D6 reversely connected in series between the output terminal H1 of the position sensor 820 and the control electrode G of the controllable bidirectional AC switch 826. A cathode of the fifth diode D5 is connected to the output terminal H1 of the position sensor, and a cathode of the sixth diode D6 is connected to the control electrode G of the controllable bidirectional AC switch. One terminal of the third resistor R3 is connected to the high voltage output terminal C of the AC-DC conversion circuit, and the other terminal of the third resistor R3 is connected to a connection point of an anode of the fifth diode D5 and an anode of the sixth diode D6. Two terminals of the fourth resistor R4 are connected to a cathode of the fifth diode D5 and a cathode of the sixth diode D6 respectively.

Figure 8:
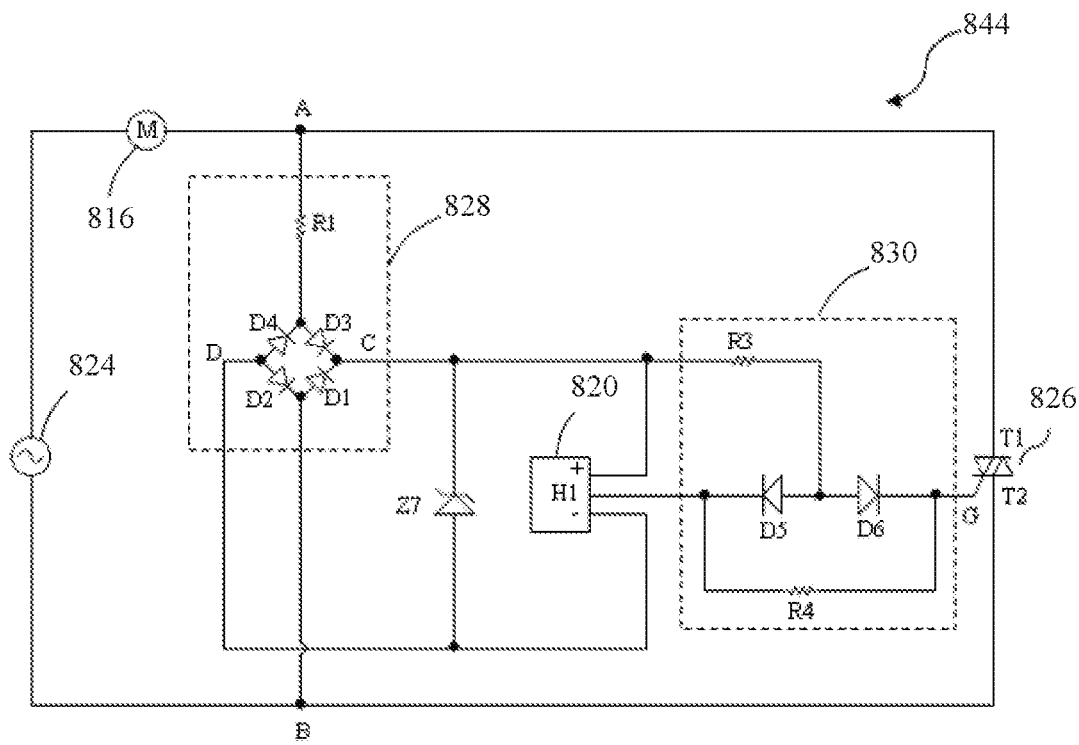

FIG. 8 shows a circuit diagram of a drive circuit 844 for a synchronous motor according to a further embodiment of the present invention. The drive circuit 844 is similar to the drive circuit 842 in the previous embodiment and, the drive circuit 844 differs from the drive circuit 842 in that, the zener diodes Z2 and Z4 in the drive circuit 842 are replaced by general diodes D2 and D4 in the rectifier of the drive circuit 844. In addition, a zener diode Z7 is connected between the two output terminals C and D of the AC-DC conversion circuit 828 in the drive circuit 844.

Figure 9:
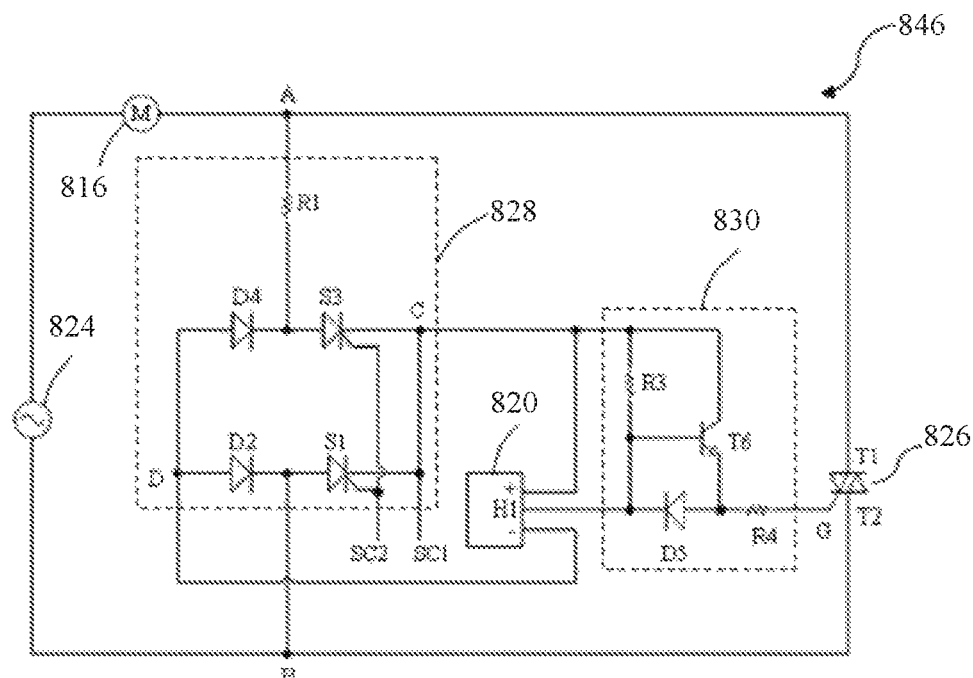

FIG. 9 shows a circuit diagram of a drive circuit 846 for a synchronous motor according to further embodiment of the present invention. The stator winding 816 of the synchronous motor is connected in series with the AC power supply 824 between the two nodes A and B. A first anode Ti of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes two silicon control rectifiers S1 and S3 reversely connected in series, and the other of the two rectifier branches includes a second diode D2 and a fourth diode D4 reversely connected in series. The high voltage output terminal C of the AC-DC conversion circuit 828 is formed at a connection point of a cathode of the silicon control rectifier S1 and a cathode of the silicon control rectifier S3, and the low voltage output terminal D of the AC-DC conversion circuit 828 is formed at a connection point of an anode of the second diode D2 and an anode of the fourth diode D4. The output terminal C is connected to a positive power supply terminal of the position sensor 820, and the output terminal D is connected to a negative power supply terminal of the position sensor 820. The switch control circuit 830 includes a third resistor R3, an NPN transistor T6, and a fourth resistor R4 and a fifth diode D5 connected in series between the output terminal H1 of the position sensor 820 and the control electrode G of the controllable bidirectional AC switch 826. A cathode of the fifth diode D5 is connected to the output terminal H1 of the position sensor. One terminal of the third resistor R3 is connected to the high voltage output terminal C of the AC-DC conversion circuit, and the other terminal of the third resistor R3 is connected to the output terminal H1 of the position sensor. A base of the NPN transistor T6 is connected to the output terminal H1 of the position sensor, an emitter of the NPN transistor T6 is connected to an anode of the fifth diode D5, and a collector of the NPN transistor T6 is connected to the high voltage output terminal C of the AC-DC conversion circuit.

In this embodiment, a reference voltage may be input to the cathodes of the two silicon control rectifiers S1 and S3 via a terminal SC1, and a control signal may be input to control terminals of S1 and S3 via a terminal SC2. The rectifiers S1 and S3 are switched on in a case that the control signal input from the terminal SC2 is a high level, or are switched off in a case that the control signal input from the terminal SC2 is a low level. Based on the configuration, the rectifiers S1 and S3 may be switched between a switch-on state and a switch-off state in a preset way by inputting the high level from the terminal SC2 in a case that the drive circuit operates normally. The rectifiers S1 and S3 are switched off by changing the control signal input from the terminal SC2 from the high level to the low level in a case that the drive circuit fails. In this case, the TRIAC 826, the conversion circuit 828 and the position sensor 820 are switched off, to ensure the whole circuit to be in a zero-power state.

Figure 10:
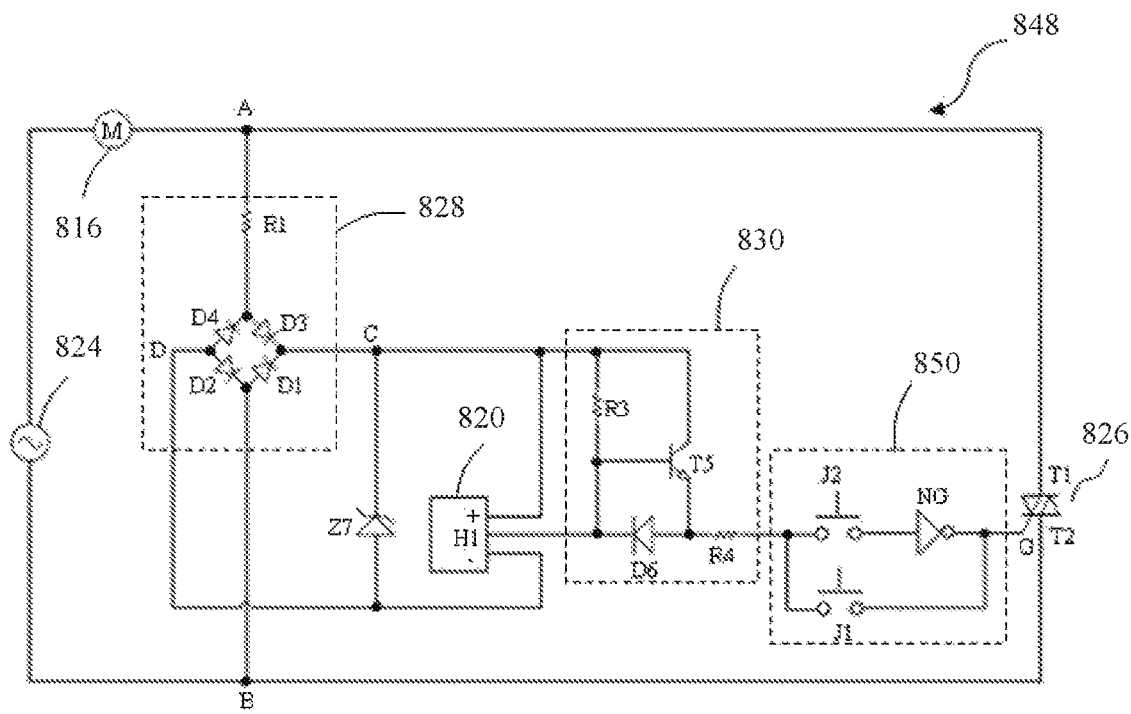

FIG. 10 shows a circuit diagram of a drive circuit 848 for a synchronous motor according to another embodiment of the present invention. The drive circuit 848 is similar to the drive circuit 846 in the previous embodiment and, the drive circuit 848 differs from the drive circuit 846 in that, the silicon control diodes S1 and S3 in the drive circuit 846 are replaced by general diodes D1 and D3 in the rectifier of the drive circuit 848, and a zener diode Z7 is connected between the two terminals C and D of the AC-DC conversion circuit 828. In addition, in the drive circuit 848 according to the embodiment, a preset steering circuit 850 is disposed between the switch control circuit 30 and the TRIAC 826. The preset steering circuit 850 includes a first jumper switch J1, a second jumper J2 switch and an inverter NG connected in series with the second jumper switch J2. Similar to the drive circuit 846, in this embodiment, the switch control circuit 830 includes the resistor R3, the resistor R4, the NPN transistor T5 and the diode D6. One terminal of the resistor R4 is connected to a connection point of an emitter of the transistor T5 and an anode of the diode D6, and the other terminal of the resistor R4 is connected to one terminal of the first jumper switch J1, and the other terminal of the first jumper switch J1 is connected to the control electrode G of the TRIAC 826, and the second jumper switch J2 and the inverter NG connected in series are connected across two terminals of the first jumper switch J1. In this embodiment, when the first jumper switch J1 is switched on and the second jumper switch J2 is switched off, similar to the above embodiments, the rotor 814 still starts clockwise; when the second jumper switch J2 is switched on and the first jumper switch J1 is switched off, the rotor 814 starts counterclockwise. In this case, a starting direction of the rotor in the motor may be selected by selecting one of the two jumper switches to be switched on and the other to be switched off. Therefore, in a case that a driving motor is needed to be supplied for different applications having opposite rotational directions, it is just needed to select one of the two jumper switches J1 and J2 to be switched on and the other to be switched off, and no other changes need to be made to the drive circuit, hence, the drive circuit according to this embodiment has good versatility.

As discussed above, the position sensor 820 is configured for detecting the magnetic pole position of the permanent magnet rotor 814 of the synchronous motor 810 and outputting a corresponding signal. The output signal from the position sensor 820 represents some characteristics of the magnetic pole position such as the polarity of the magnetic field associated with the magnetic pole position of the permanent magnet rotor 814 of the synchronous motor 810. The detected magnetic pole position is then used, by the switch control circuit 830, control the controllable bidirectional AC switch 824 to be switched between a switch-on state and a switch-off state in a predetermined way, based on, together with the magnetic pole position of the permanent magnet rotor, the polarity information of the AC power supply 824 which may be obtained from the AC-DC conversion circuit 828. It should be appreciated that the switch control circuit 830 and the position sensor 820 can be realized via magnetic sensing. Accordingly, the present disclosure discloses a magnetic sensor integrated circuit for magnetic sensing and control of a motor according to the sensed information.

The magnetic sensor integrated circuit according to the present disclosure includes a magnetic field detecting circuit that can reliably detect a magnetic field and generate a magnetic induction signal indicative of certain characteristics of the magnetic field. The magnetic sensor as disclosed herein also includes an output control circuit that controls the magnetic sensor to operate in a state determined with respect to the polarity of the magnetic field as well as that of an AC power supply. In a case the magnetic sensor integrated circuit is coupled with the bidirectional AC switch, the magnetic sensor integrated circuit can effectively regulate the operation of the motor via the bidirectional AC switch. Further, the magnetic sensor integrated circuit in the present disclosure may be directly connected to a commercial/residential AC power supply with no need for any additional A/D converting equipment. In this way, the present disclosure of the magnetic sensor integrated circuit is suitable to be used in a wide range of applications.

Additional novel features associated with the magnetic sensor integrated circuit disclosed herein will be set forth in part in the description which follows, and in part will become apparent to those skilled in the art upon examination of the following and the accompanying drawings or may be learned by production or operation of the examples. The novel features of the present disclosure on a magnetic sensor integrated circuit may be realized and attained by practice or use of various aspects of the methodologies, instrumentalities and combinations set forth in the detailed examples discussed below. The disclosed magnetic sensor integrated circuit, and a motor component incorporating the magnetic sensor integrated circuit and an application device disclosed herein can be achieved realized based on any circuit technology known to one of ordinary skill in the art including but not limited to the integrated circuit and other circuit implementations.

Hereinafter, a magnetic sensor integrated circuit according to an embodiment of the present disclosure is explained by taking the magnetic sensor integrated circuit applied to a motor as an example.

Figure 11:
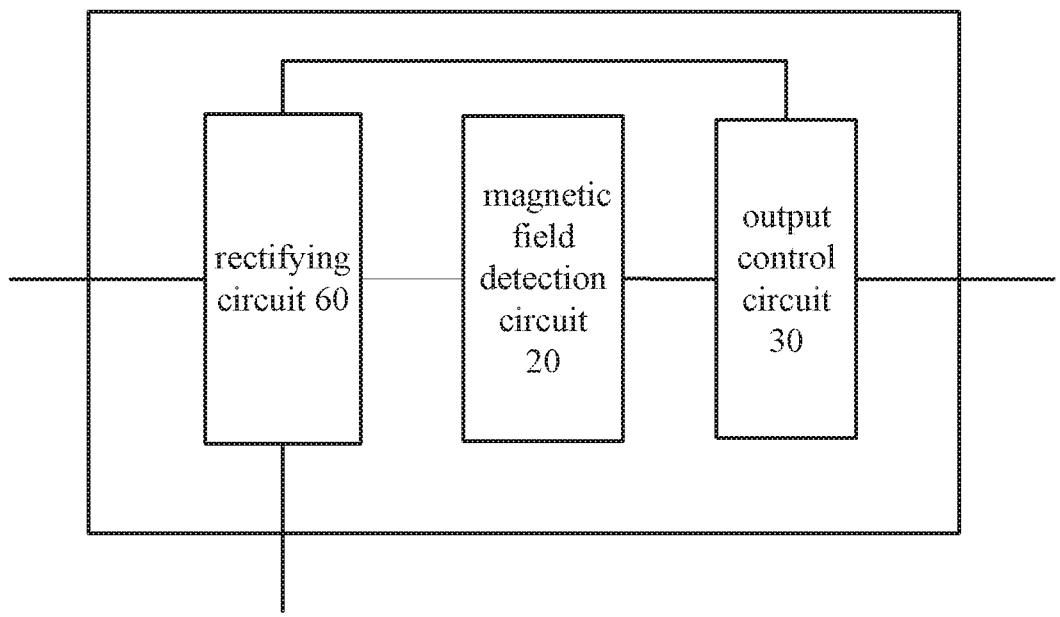
FIG. 11 is a structural diagram of a magnetic sensor integrated circuit according to an embodiment of the present disclosure.

As shown in FIG. 11, a magnetic sensor integrated circuit is provided according to an embodiment of the present disclosure. The magnetic sensor integrated circuit includes a shell 2, a semiconductor substrate (not shown in the drawing) provided inside the shell, input ports A1 and A2 and an output port Pout all of which extend from the shell, and an electronic circuit provided on the semiconductor substrate. The electronic circuit includes:

a magnetic field detection circuit 20 configured to detect an external magnetic field and output magnetic field detection information; and an output control circuit 30 configured to enable, at least based on the magnetic field detection information, the integrated circuit to switch at least between a first state, in which a current flows from the output port to an outside of the integrated circuit, and a second state, in which a current flows from the outside of the integrated circuit to the output port.

It should be noted that, according to the embodiments of the disclosure, the magnetic sensor integrated circuit switches operations between the first state and the second state, which is not limited to a case that the magnetic sensor integrated circuit switches to the other state immediately after one state ends, but further includes a case that the magnetic sensor integrated circuit switches to the other state in a certain time interval after one state ends. According to a preferable embodiment, there is no output at the output port of the magnetic sensor integrated circuit in the certain time interval between the two states.

Figure 12:
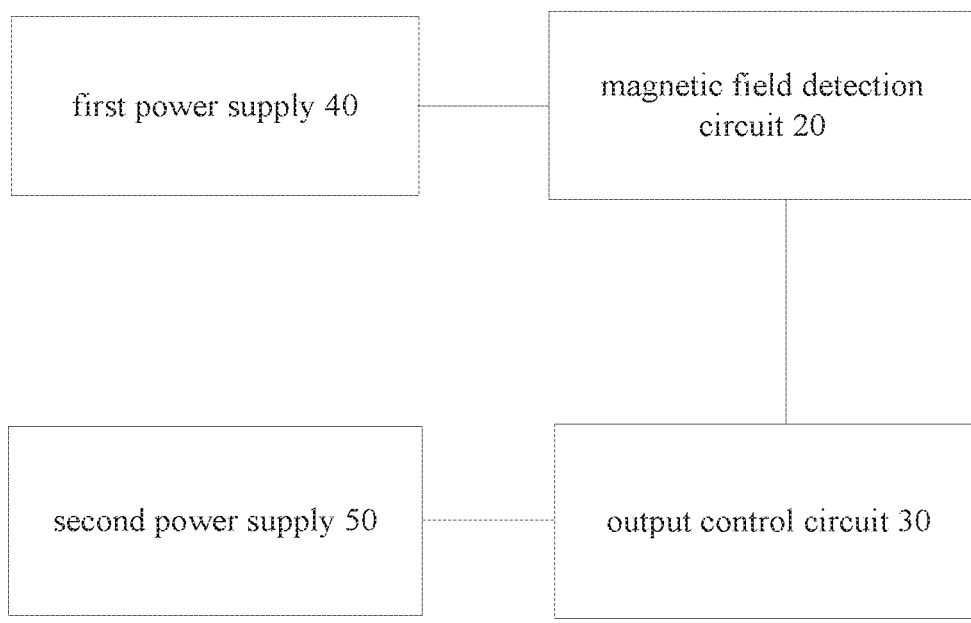
FIG. 12 is a structural diagram of a magnetic sensor integrated circuit according to an embodiment of the present disclosure.

On the basis of the above-described embodiment, in an embodiment of the present disclosure, as shown in FIG. 12, the magnetic field detection circuit 20 is powered by a first power supply 40, and the output control circuit 30 is powered by a second power supply 50 different from the first power supply 40. It should be noted that, in the embodiment of the present disclosure, the second power supply 50 may be a power supply with a variable amplitude or a DC power supply with a constant amplitude. The second power supply 50 is preferably a DC power supply with a variable amplitude in a case that the second power supply 50 is the power supply with a variable amplitude, which is not limited in the present disclosure, as the case may be.

On the basis of the above-described embodiment, in an embodiment of the present disclosure, the first power supply 40 is a DC power supply with a constant amplitude to provide a stable driving signal to the magnetic field detection circuit 20 so that the magnetic field detection circuit 20 operates stably.

On the basis of the above-described embodiment, in a preferable embodiment of the present disclosure, an average value of an output voltage of the first power supply 40 is less than an average value of an output voltage of the second power supply 50. It should be noted that, the magnetic field detection circuit 20 is powered by a power supply with low power consumption, and thus the power consumption of the integrated circuit may be reduced. The output control circuit 30 is powered by a power supply with high power consumption, and thus the output port provides a high load current to ensure the integrated circuit to have enough drive capability.

On the basis of the above-described embodiment, in an embodiment of the present disclosure, the output control circuit 30 includes a first switch and a second switch, the first switch is connected to the output port in a first current path, the second switch is connected to the output port in a second current path having an opposite direction to a direction of the first current path, and the first switch and the second switch are turned on selectively based on the magnetic field detection information. Preferably, the first switch may be a triode, and the second switch may be a triode or a diode, which is not limited in the present disclosure, as the case may be.

Figure 13:
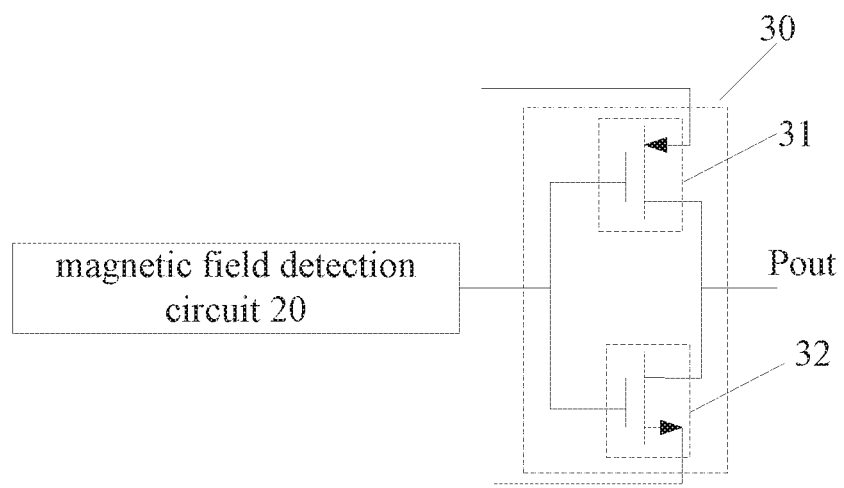
FIG. 13 is a structural diagram of an output control circuit in a magnetic sensor integrated circuit according to an embodiment of the present disclosure.

Specifically, in an embodiment of the present disclosure, as shown in FIG. 13, the first switch 31 and the second switch 32 are a pair of complementary semiconductor switches. The first switch 31 is turned on at a low level, and the second switch 32 is turned on at a high level. The first switch 31 is connected to the output port Pout in a first current path, and the second switch 32 is connected to the output port Pout in a second current path, both a control terminal of the first switch 31 and a control terminal of the second switch 32 are connected to the magnetic field detection circuit 20, a current input terminal of the first switch 31 is connected to a high voltage terminal (such as a DC power supply), a current output terminal of the first switch 31 is connected to a current input terminal of the second switch 32, and a current output terminal of the second switch 32 is connected to a low voltage terminal (such as the ground). The first switch 31 is turned on, the second switch 32 is turned off and the load current flows from the high voltage terminal to an outside of the integrated circuit through the first switch 31 and the output port Pout, in a case that magnetic field detection information outputted by the magnetic field detection circuit 20 is a low level. The second switch 32 is turned on, the first switch 31 is turned off and the load current flows from the outside of the integrated circuit to the output port Pout through the second switch 32, in a case that magnetic field detection information outputted by the magnetic field detection circuit 20 is a high level. According to the embodiment shown in FIG. 13, the first switch 31 is a p-channel metal oxide semiconductor field effect transistor (P-Channel MOSFET), and the second switch 32 is an n-channel metal oxide semiconductor field effect transistor (N-Channel MOSFET). It should be understood that, in other embodiments, the first switch and the second switch may be other types of semiconductor switches, e.g., other field effect transistors such as a junction field effect transistor (JFET) or a metal semiconductor field effect transistor (MESFET).

Figure 14:
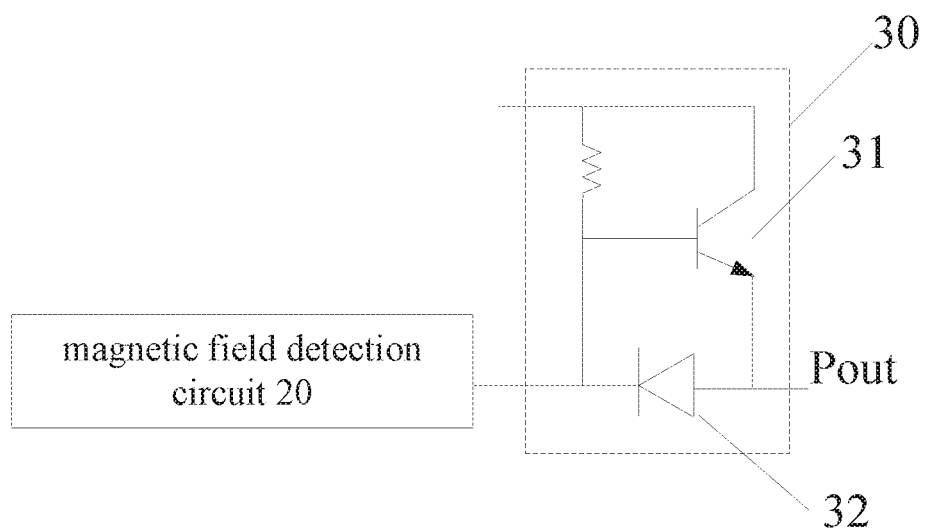
FIG. 14 is a structural diagram of an output control circuit in a magnetic sensor integrated circuit according to an embodiment of the present disclosure.

In another embodiment of the present disclosure, as shown in FIG. 14, the first switch 31 is a switch transistor which is turned on at a high level, the second switch 32 is a unidirectional diode, and a control terminal of the first switch 31 and a cathode of the second switch 32 are connected to the magnetic field detection circuit 20. The current input terminal of the first switch 31 is connected to the second power supply 50, and the current output terminal of the first switch 31 and an anode of the second switch 32 are connected to the output port Pout. The first switch 31 is connected to the output port Pout in the first current path, and the output port Pout, the second switch 32 and the magnetic field detection circuit 20 are connected in the second current path. The first switch 31 is turned on, the second switch 32 is turned off and the load current flows from the second power supply 50 to the outside of the integrated circuit through the first switch 31 and the output port Pout, in a case that the magnetic field detection information outputted by the magnetic field detection circuit 20 is a high level. The second switch 32 is turned on, the first switch 31 is turned off and the load current flows from the outside of the integrated circuit to the output port Pout through the second switch 32, in a case that the magnetic field detection information outputted by the magnetic field detection circuit 20 is a low level. It can be understood that, in other embodiments of the present disclosure, the first switch 31 and the second switch 32 may further have other structures, which is not limited in the present disclosure, as the case may be.

In another embodiment of the present disclosure, the output control circuit 30 includes a first current path in which a current flows from the output port to an outside, a second current path in which a current flows from the output port to an inside, and a switch connected in one of the first current path and the second current path, where the switch is controlled by the magnetic field detection information outputted by the magnetic field detection circuit, and allows the first current path and the second current path to be selectively turned on. Preferably, no switch is provided in the other one of the first current path and the second current path.

Figure 15:
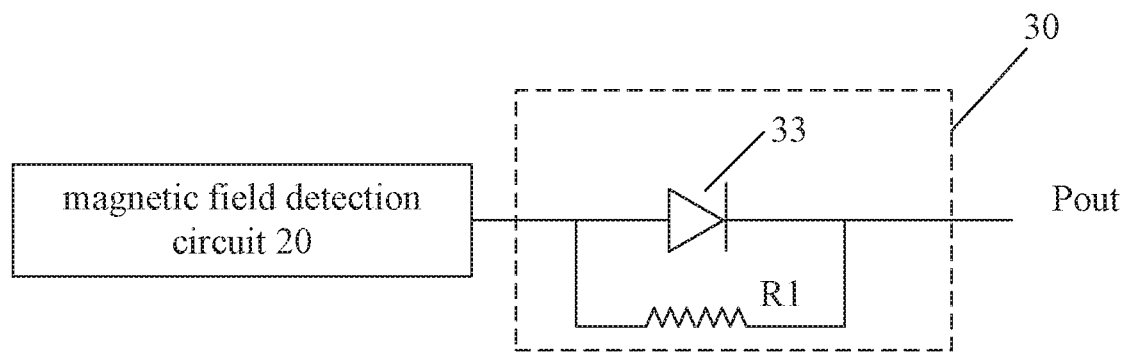
FIG. 15 is a structural diagram of an output control circuit in a magnetic sensor integrated circuit according to an embodiment of the present disclosure.

As an embodiment, as shown in FIG. 15, the output control circuit 30 includes an unidirectional switch 33, the unidirectional switch 33 is connected to the output port Pout in the first current path, a current input terminal of the unidirectional switch 33 may be connected to an output terminal of the magnetic field detection circuit 20, and the output terminal of the magnetic field detection circuit 20 may further be connected to the output port Pout through a resistor R1 in the second current path having an opposite direction to a direction of the first current path. The unidirectional switch 33 is turned on in a case that a magnetic field sensing signal is a high level, the load current flows to the outside of the integrated circuit through the unidirectional switch 33 and the output port Pout. The unidirectional switch 33 is turned off in a case that the magnetic field sensing signal is a low level, the load current flows from the outside of the integrated circuit to the output port Pout through the resistor R1 and the magnetic field detection circuit 20. As an alternative, the resistor R1 in the second current path may be replaced with another unidirectional switch in anti-parallel with the unidirectional switch 33. In this way, a load current flowing from the output port and a load current flowing to the output port are balanced.

Figure 15A:
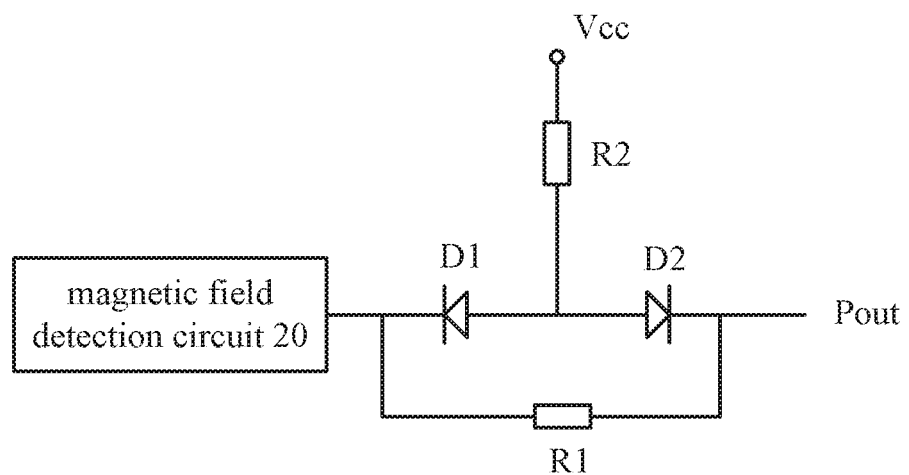
FIG. 15A is a structural diagram of an output control circuit in a magnetic sensor integrated circuit according to an embodiment of the present disclosure.

In another embodiment, as shown in FIG. 15A, the output control circuit 30 includes diodes D1 and D2 both of which are in reversed series connection between the output terminal of the magnetic field detection circuit 20 and the output port Pout, a resistor R1 connected in parallel with series diodes D1 and D2, and a resistor R2 connected between, a common terminal of the diodes D1 and D2, and the power supply Vcc. The cathode of the diode D1 is connected to the output terminal of the magnetic field detection circuit 20. The power supply Vcc may be connected to the voltage output terminal of the rectifying circuit. The diode D1 is controlled by the magnetic field detection information. The diode D1 is turned off in a case that the magnetic field detection information is at a high level, and the load current flows from the output port Pout to the outside through the resistor R2 and the diode D2. In a case that the magnetic field detection information is at a low level, the load current flows from the outside to the output port Pout and flows through the resistor R1 and the magnetic field detection circuit 20.

On the basis of any one of the above-described embodiments, in an embodiment of the present disclosure, the input port includes an input port configured to connect an external AC power supply, the output control circuit 30 enables, based on the magnetic field detection information and a polarity of the AC power supply, the integrated circuit to operate in at least one of the first state and the second state which are switched with each other. Preferably, the magnetic field detection circuit 20 may have a same power supply as the output control circuit 30.

On the basis of the above-described embodiment, in an embodiment of the present disclosure, the output control circuit 30 is configured to allow the output port to have a flowing load current in a case that the alternating current power supply is in a positive half-cycle and a polarity of an external magnetic field detected by the magnetic field detection circuit 20 is a first polarity, or in a case that the alternating current power supply is in a negative half-cycle and the polarity of the external magnetic field detected by the magnetic field detection circuit is a second polarity reverse to the first polarity, and is configured to allow the output port to have no flowing load current in a case that the alternating current power supply is in a positive half-cycle and the polarity of the external magnetic field is the second polarity, or in a case that the alternating current power supply is in a negative half-cycle and the polarity of the external magnetic field is the first polarity. It should be noted that, the situation that the output port has a flowing load current in a case that the alternating current power supply is in the positive half-cycle and the polarity of the external magnetic field is the first polarity, or in a case that the alternating current power supply is in the negative half-cycle and the polarity of the external magnetic field is the second polarity, may be a situation that the output port has a flowing load current during entire periods in the two cases, or may be a situation that the output port has a flowing load current during partial periods in the two cases.

Figure 16:
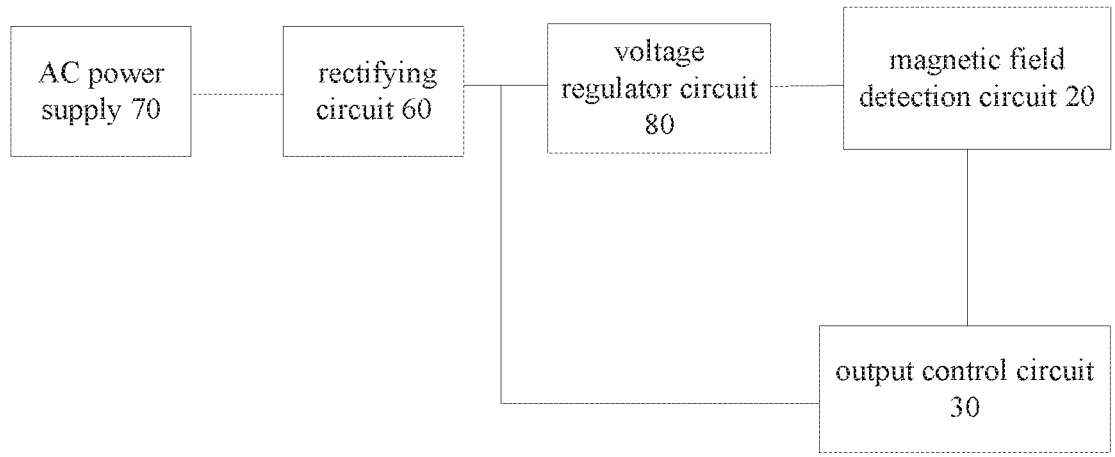
FIG. 16 is a structural diagram of a magnetic sensor integrated circuit according to an embodiment of the present disclosure.

On the basis of the above-described embodiment, in an embodiment of the present disclosure, the input port may include a first input port and a second input port configured to connect an external AC power supply. In the present disclosure, the input port being connected to the external power supply includes a case in which the input port is connected to two terminals of the external power supply directly, and a case in which the input port is connected in series with an external load across two terminals of the external power supply, which is not limited in the present disclosure, as the case may be. As shown in FIG. 16, in an embodiment of the present disclosure, the rectifying circuit further includes a rectifying circuit 60 configured to convert an alternating current outputted by the external AC power supply 70 into a direct current.

It should be noted that, in the embodiments of the present disclosure, the output control circuit 30 connected to the rectifying circuit 60 may be configured to enable, at least based on the magnetic field detection information, the integrated circuit to operate in one of the first state in which a load current flows from the output port to the outside of the integrated circuit and the second state in which a load current flows from the outside of the integrated circuit to the output port which are switched with each other, where the load current further flows through the rectifying circuit 60.

On the basis of the above-described embodiment, in a preferable embodiment of the present disclosure, the integrated circuit further includes a voltage regulator circuit 80 arranged between the rectifying circuit 60 and the magnetic field detection circuit 20. In this embodiment, the rectifying circuit 60 may serve as a second power supply 50, the voltage regulator circuit 80 may serve as a first power supply 40. The voltage regulator circuit 80 is configured to regulate a first voltage outputted by the rectifying circuit 60 to a second voltage, the second voltage is a supply voltage for the magnetic field detection circuit 20, the first voltage is a supply voltage for the output control circuit 30, and an average value of the first voltage is greater than an average value of the second voltage to reduce the power consumption of the integrated circuit and allow the integrated circuit to have enough driving capability.

Figure 17:
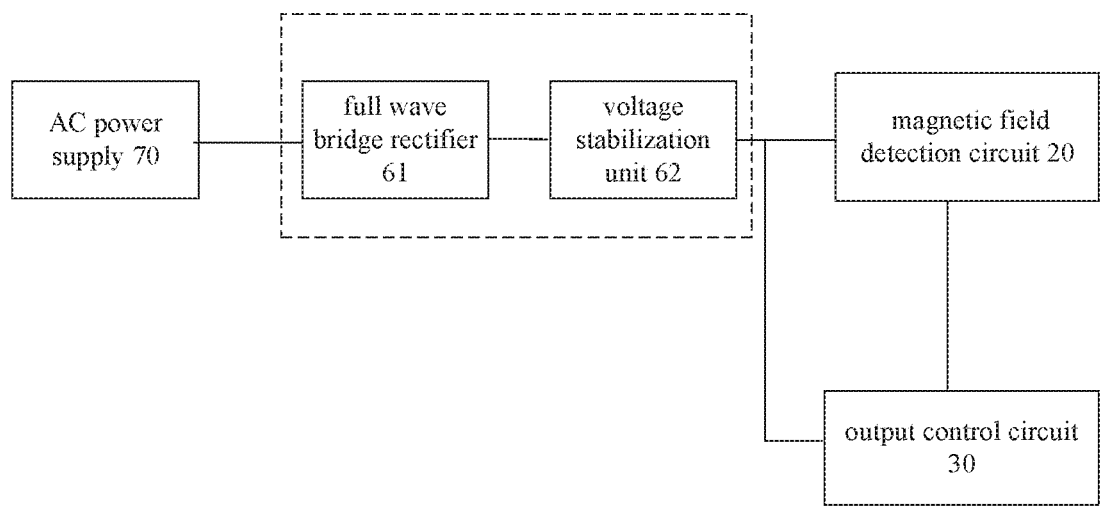
FIG. 17 is a structural diagram of a magnetic sensor integrated circuit according to an embodiment of the present disclosure.

In a specific embodiment of the present disclosure, as shown in FIG. 17, the rectifying circuit 60 includes a full wave bridge rectifier 61 and a voltage stabilization unit 62 connected to an output terminal of the full wave bridge rectifier 61. The full wave bridge rectifier 61 is configured to convert an alternating current outputted by the AC power supply 70 into a direct current, and the voltage stabilization unit 62 is configured to stabilize the DC signal outputted by the full wave bridge rectifier 61 to fall within a preset value range.

Figure 18:
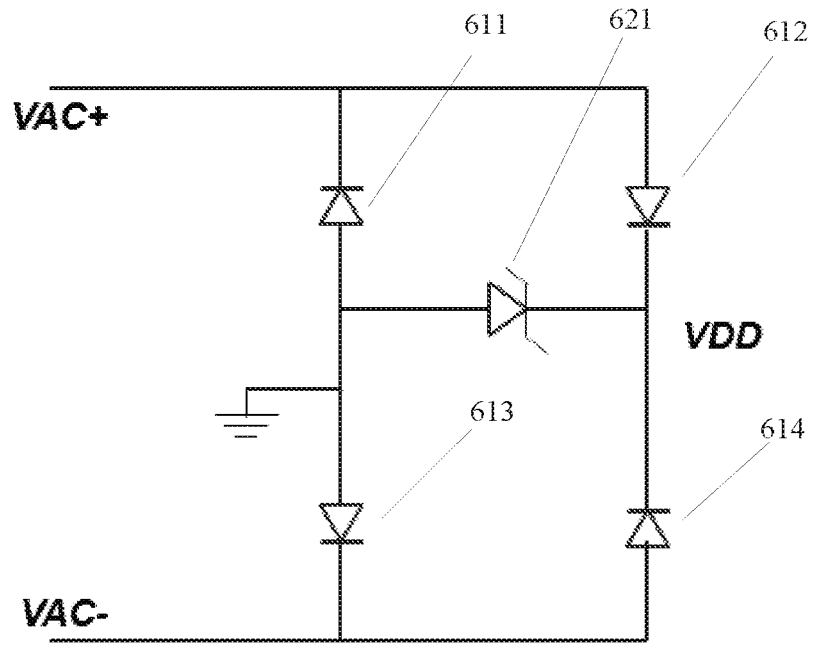
FIG. 18 is a structural diagram of a rectifying circuit in a magnetic sensor integrated circuit according to an embodiment of the present disclosure.

FIG. 18 shows a specific circuit of the rectifying circuit 60. The voltage stabilization unit 62 includes a Zener diode 621 connected between two output terminals of the full wave bridge rectifier 61. The full wave bridge rectifier 61 includes a first diode 611 and a second diode 612 connected in series and a third diode 613 and a fourth diode 614 connected in series, a common terminal of the first diode 611 and the second diode 612 is electrically connected to the first input port VAC+, and a common terminal of the third diode 613 and the fourth diode 614 is electrically connected to the second input port VAC−.

Specifically, a grounded output terminal of the full wave bridge rectifier is formed by electrically connecting an input terminal of the first diode 611 to an input terminal of the third diode 613, a voltage output terminal VDD of the full wave bridge rectifier is formed by electrically connecting an output terminal of the second diode 612 to an output terminal of the fourth diode 614, the Zener diode 621 is connected between a common terminal of the second diode 612 and the fourth diode 614 and a common terminal of the first diode 611 and the third diode 613. It should be noted that, in the embodiment of the present disclosure, a power terminal of the output control circuit 30 may be electrically connected to the voltage output terminal of the full wave bridge rectifier 61.

Figure 19:
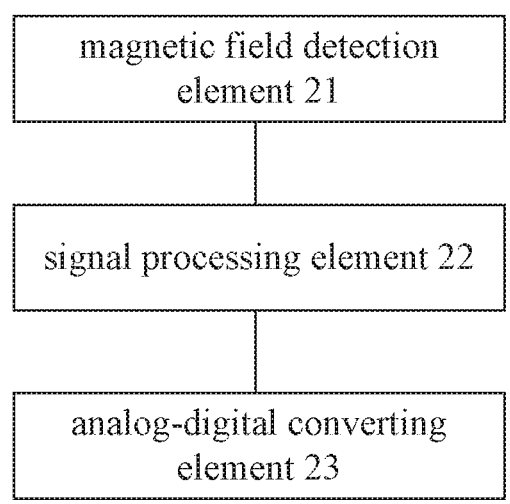
FIG. 19 is a structural diagram of a magnetic field detection circuit in a magnetic sensor integrated circuit according to an embodiment of the present disclosure.

On the basis of any one of the above-described embodiments, in an embodiment of the present disclosure, as shown in FIG. 19, the magnetic field detection circuit 20 includes: a magnetic field detection element 21 configured to detect the external magnetic field and convert the external magnetic field into an electric signal; a signal processing unit 22 configured to amplify and descramble the electric signal; and an analog-digital converting unit 23 configured to convert the amplified and descrambled electric signal into the magnetic field detection information. The magnetic field detection information may be a switch-type digital signal for an application only identifying a polarity of a magnetic field of the external magnetic field. Preferably, the magnetic field detection element 21 may be a Hall plate.

In a preferable embodiment, in a case that the input port includes a first input port and a second input port both of which are configured to connect an external AC power supply, frequencies of occurrence of the first state or the second state are proportional to a frequency of the AC power supply. It should be understood that, the disclosure is not limited herein.

Hereinafter, the magnetic sensor integrated circuit according to the embodiment of the present disclosure is described in conjunction with a specific application.

Figure 20:
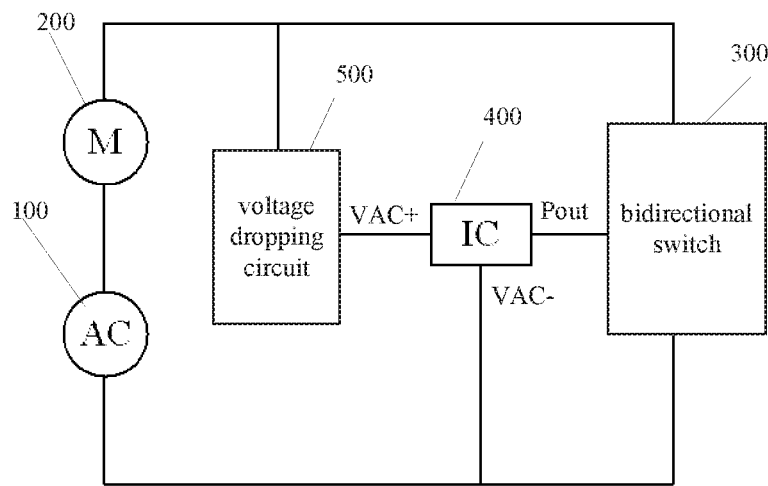
FIG. 20 is a structural diagram of a motor component according to an embodiment of the present disclosure.

As shown in FIG. 20, a motor component is further provided according to an embodiment of the present disclosure. The motor component includes: a motor 200 powered by an AC power supply 100, a bidirectional switch 300 connected in series with the motor 200, and the magnetic sensor integrated circuit 400 according to any one of the above-described embodiments, where the output port of the magnetic sensor integrated circuit 400 is electrically connected to a control terminal of the bidirectional switch 300. Preferably, the bidirectional switch 300 may be a triac (TRIAC). It should be understood that, the bidirectional switch may be realized by other types of suitable switches, e.g., the bidirectional switch may include two anti-parallel silicon-controlled rectifiers, a corresponding control circuit is provided, and an output signal of the output port of the magnetic sensor integrated circuit flows through the control circuit and controls the two silicon-controlled rectifiers in a preset way.

Preferably, the motor component further includes a voltage dropping circuit 500 for reducing a voltage of the AC power supply 100 and providing the reduced voltage to the magnetic sensor integrated circuit 400. The magnetic sensor integrated circuit 400 is arranged near a rotor of the motor 200 to sense change in a magnetic field of the rotor.

Figure 21:
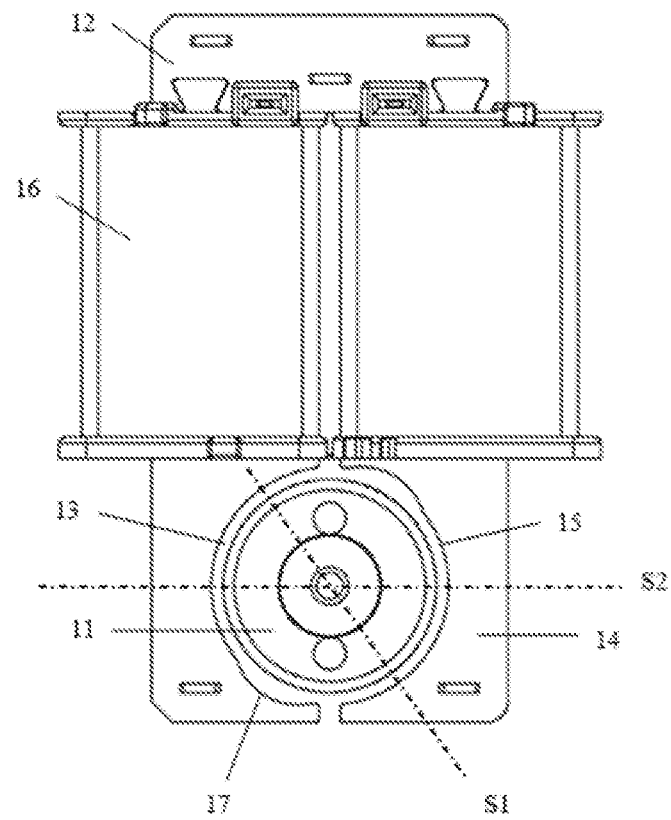
FIG. 21 is a structural diagram of a motor in a motor component according to an embodiment of the present disclosure.

On the basis of the above-described embodiment, in a specific embodiment of the present disclosure, the motor is a synchronous motor. It should be understood that, the magnetic sensor integrated circuit is applicable to the synchronous motor as well as other types of permanent magnet motors such as a brushless DC motor. As shown in FIG. 21, the synchronous motor includes a stator and a rotor 11 rotatable relative to the stator. The stator includes a stator core 12 and a stator winding 16 wound on the stator core 12. The stator core 12 may be made of soft magnetic materials such as pure iron, cast iron, cast steel, electrical steel, silicon steel. The rotor 11 includes a permanent magnet, the rotor 11 operates at a constant rotational speed of 60 f/p revs/min during a steady state phase in a case that the stator winding 16 is connected in series with an AC power supply, where f is a frequency of the AC power supply and p is the number of pole pairs of the rotor. In the embodiment, the stator core 12 includes two poles 14 reverse to each other. Each of the poles 14 includes a pole arc 15, an outside surface of the rotor 11 is reverse to the pole arc 15, and a substantially uniform air gap 13 is formed between the outside surface of the rotor 11 and the pole arc 15. The "substantially uniform air gap" in the present disclosure means that a uniform air gap is formed in most space between the stator and the rotor, and a non-uniformed air gap is formed in a small part of the space between the stator and the rotor. Preferably, a starting groove 17 which is concave may be disposed in the pole arc 15 of the pole of the stator, and a part of the pole arc 15 rather than the starting groove 17 may be concentric with the rotor. With the configuration described above, the non-uniform magnetic field may be formed, a polar axis S1 of the rotor has an angle of inclination relative to a central axis S2 of the pole of the stator in a case that the rotor is at rest, and the rotor may have a starting torque every time the motor is energized under the action of the integrated circuit. Specifically, the "pole axis S1 of the rotor" refers to a boundary between two magnetic poles having different polarities, and the "central axis S2 of the pole 14 of the stator" refers to a connection line passing central points of the two poles 14 of the stator. In the embodiment, both the stator and the rotor include two magnetic poles. It can be understood that the number of magnetic poles of the stator may not be equal to the number of magnetic poles of the rotor, and the stator and the rotor may have more magnetic poles, such as 4 or 6 magnetic poles in other embodiments. It should be understandable that other type of non-uniformed air gap may be alternatively formed between the rotor and the stator.

On the basis of the above-described embodiment, in an embodiment of the present disclosure, the output control circuit 30 is configured to turn on the bidirectional switch 300 in a case that the AC power supply 100 is in a positive half-cycle and a polarity of magnetic field of the permanent magnet rotor detected by the magnetic field detection circuit 20 is a first polarity, or in a case that the AC power supply 100 is in a negative half-cycle and the polarity of magnetic field of the permanent magnet rotor detected by the magnetic field detection circuit 20 is a second polarity reverse to the first polarity, or to turn off the bidirectional switch 300 in a case that the AC power supply 100 is in a negative half-cycle and the polarity of magnetic field of the permanent magnet rotor is the first polarity, or in a case that the AC power supply 100 is in a positive half-cycle and the polarity of magnetic field of the permanent magnet rotor is the second polarity.

Preferably, the output control circuit 30 is configured to control a current to flow from the integrated circuit to the bidirectional switch 300 in a case that a signal outputted by the AC power supply 100 is in a positive half-cycle and the polarity of the permanent magnet rotor detected by the magnetic field detection circuit 20 is the first polarity, or control a current to flow from the bidirectional switching switch 300 to the integrated circuit in a case that the signal outputted by the AC power supply 100 is in a negative half-cycle and the polarity of the permanent magnet rotor detected by the magnetic field detection circuit 20 is the second polarity reverse to the first polarity. It should be understood that, the situation that the integrated circuit has a flowing current in a case that the polarity of the permanent magnetic rotor is the first polarity and the alternating current power supply is in the positive half-cycle and, or in a case that the polarity of the permanent magnetic rotor is the second polarity and the alternating current power supply is in the negative half-cycle, may be a situation that the integrated circuit has a flowing current during entire periods in the two cases, or may be a situation that the integrated circuit has a flowing current during partial periods in the two cases.

In a preferable embodiment of the present disclosure, the bidirectional switch 300 may be a triac (TRIAC), the rectifying circuit 60 is configured to be a circuit as shown in FIG. 18, an output control circuit is configured to be a circuit as shown in FIG. 14, a current input terminal of the first switch 31 in the output control circuit 30 is connected to a voltage output terminal of the full wave bridge rectifier 61, and a current output terminal of the second switch 32 is connected to a grounded output terminal of the full wave bridge rectifier 61. In a case that a signal outputted by the AC power supply 100 is in a positive half-cycle and the magnetic detection circuit 20 outputs a low level, the first switch 31 is turned on and the second switch 32 is turned off in the output control circuit 30, a current flows through the AC power supply 100, the motor 200, a first input terminal of the integrated circuit 400, a voltage dropping circuit, an output terminal of the second diode 612 of the full wave bridge rectifier 61, the first switch 31 of the output control circuit 30 in sequence, from an output port to the bidirectional switch 300 and back to the AC power supply 100. After TRIAC 300 is turned on, a series branch formed by the voltage dropping circuit 500 and the magnetic sensor integrated circuit 400 is shorted, the magnetic sensor integrated circuit 400 stops outputting due to a lack of power supply. Since a current flowing through the two anodes of the TRIAC 300 is large enough, the TRIAC 300 is still in an on-state in a condition that there is no drive current between a control terminal and a first anode thereof. In a case that the signal outputted by the AC power supply 100 is in a negative half-cycle and the magnetic field detection circuit 20 outputs a high level, the first switch 31 is turned off and the second switch 32 is turned on in the output control circuit 30, the current flows from the AC power supply 100, from the bidirectional switch 300 to the output port, through the second switch 32 of the output control circuit 30, the grounded output terminal and the first diode 611 of the full wave bridge rectifier 61, the first input terminal of the integrated circuit 400, the motor 200 and back to the AC power supply 100. Similarly, after the TRIAC 300 is turned on, the magnetic sensor integrated circuit 400 stops outputting because the magnetic sensor integrated circuit 400 is shorted, and the TRIAC 300 may keep in the on-state. The first switch 31 and the second switch 32 in the output control circuit 30 can neither be turned on and the TRIAC 300 is turned off, in a case that the signal outputted by the AC power supply 100 is in the positive half-cycle and the magnetic field detection circuit 20 outputs a high level or in a case that the signal outputted by the AC power supply 100 is in the negative half-cycle and the magnetic field detection circuit 20 outputs a low level. Therefore, the output control circuit 30 can enable, based on a polarity of the AC power supply 100 and the magnetic field detection information, the integrated circuit to control the bidirectional switch 300 to be switched between a turn-on state and a turn-off state in a preset way, and then to control an energized mode of the stator winding 16 so that a variation magnetic field generated by the stator fits a position of a magnetic field of the rotor and drags the rotor to rotate in a single direction, thereby enabling the rotor to rotate in a fixed direction every time the motor is energized.

It can be seen from the above description that, the magnetic sensor integrated circuit according to the embodiments of the present disclosure includes an input port, an output port, a magnetic field detection circuit 20 and an output control circuit 30. The magnetic field detection circuit 20 is configured to detect an external magnetic field and output magnetic field detection information. The output control circuit 30 is configured to enable, at least based on the magnetic field detection information, the integrated circuit to operate in one of the first state in which a load current flows from the output port to the outside of the integrated circuit and the second state in which a load current flows from the outside of the integrated circuit to the output port which are switched with each other. Therefore, in a case that the magnetic sensor integrated circuit is applied to a motor component, magnetic field information at the rotor of the motor in the motor component may be detected by the magnetic field detection circuit 20, so that the output control circuit 30 enables, at least based on the magnetic field detection information, the integrated circuit to operate in one of the first state in which a load current flows from the output port to the outside of the integrated circuit and the second state in which a load current flows from the outside of the integrated circuit to the output port which are switched with each other, and the rotor of the motor in the motor component can be ensured to rotate in a same direction every time the rotor is started.

In a motor component according to another embodiment of the disclosure, a motor may be connected in series with a bidirectional switch between tow terminals of an external alternating current power supply, a first series branch formed by the motor and the bidirectional switch is in parallel with a second series branch formed by a voltage dropping circuit and a magnetic sensor integrated circuit. A output terminal of the magnetic sensor integrated circuit is connected to the bidirectional switch, controls the bidirectional switch to switch between an on-state and an off-state in a preset way, and further controls a power mode of a stator winding.

The motor component according to the embodiments of the disclosure may be applied to but not limited to devices such as a pump, a fan, a household appliance and a vehicle, and the household appliance may be, for example, a washing machine, a dishwasher, a smoke exhauster, and an exhaust fan.

It should be noted that, an application field of the integrated circuit according to the embodiment of the present is not limited herein, although the embodiments of the present disclosure is explained by taking the integrated circuit being applied to the motor as an example.

It should be noted that, the parts in this specification are described in a progressive way, each of which emphasizes the differences from others, and the same or similar parts among the parts can be referred to each other.

It should be noted that the relationship terminologies such as "first", "second" and the like are only used herein to distinguish one entity or operation from another, rather than to necessitate or imply that an actual relationship or order exists between the entities or operations. Furthermore, terms of "include", "comprise" or any other variants are intended to be non-exclusive. Therefore, a process, method, article or device including a plurality of elements includes not only the disclosed elements but also other elements that are not clearly enumerated, or also include inherent elements of the process, method, article or device. Unless expressively limited otherwise, the statement "including a . . . " does not exclude the case that other similar elements may exist in the process, method, article or device other than enumerated elements.

The description of the embodiments herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure may not be limited to the embodiments described herein, but is in accordance with the widest scope consistent with the principles and novel features disclosed herein.

The invention claimed is:

1. A magnetic sensor integrated circuit, comprising:
at least one input port and one output port;
a magnetic field detection circuit configured to detect an external magnetic field and output magnetic field detection information accordingly; and
an output control circuit configured to selectively enable a load current flowing out to an outside of the integrated circuit from the one output port and the load current flowing into the one output port to a ground in the integrated circuit from the outside of the integrated circuit; and
wherein the output control circuit outputs a control signal to a controllable bidirectional AC switch, the controllable bidirectional AC switch is controlled to be switched between a switch-on state and a switch-off state in a predetermined way; and
the output control circuit comprises a first current path in which a current flows out from the output port, a second current path in which a current flows in from the output port, and a switch connected in one of the first current path and the second current path, wherein the switch is controlled by the magnetic field detection information outputted by the magnetic field detection circuit, and allows the first current path and the second current path to be selectively turned on.

2. The integrated circuit according to claim 1, wherein the magnetic field detection circuit is powered by a first power supply and the output control circuit is powered by a second power supply different from the first power supply.

3. The integrated circuit according to claim 2, wherein an average value of an output voltage of the first power supply is less than an average value of an output voltage of the second power supply.

4. The integrated circuit according to claim 1, wherein the at least one input port comprises an input port configured to connect an external alternating current power supply, and the output control circuit is configured to enable, based on a polarity of the alternating current power supply and the magnetic field detection information.

5. The integrated circuit according to claim 1, wherein the output control circuit comprises a first switch and a second switch, the first switch and the output port being connected in a first current path, the second switch and the output port being connected in a second current path having a direction reverse to a direction of the first current path, and the first switch and the second switch being selectively turned on under control of the magnetic field detection information.

6. The integrated circuit according to claim 1, wherein when the controllable bidirectional AC switch is conductive, the integrated circuit does not consume electrical energy.

7. The integrated circuit according to claim 6, wherein no switch is provided in the other one of the first current path and the second current path.

8. The integrated circuit according to claim 4, wherein the output control circuit is configured to control the output port to have a load current flowing through in a case that the alternating current power supply is in a positive half-cycle and a polarity of an external magnetic field detected by the magnetic field detection circuit is a first polarity, or in a case that the alternating current power supply is in a negative half-cycle and the polarity of the external magnetic field detected by the magnetic field detection circuit is a second polarity reverse to the first polarity, and to control the output port to have no load current flowing through in a case that the alternating current power supply is in a positive half-cycle and the polarity of the external magnetic field is the second polarity, or in a case that the alternating current power supply is in a negative half-cycle and the polarity of the external magnetic field is the first polarity.

9. The integrated circuit according to claim 2, wherein the at least one input port comprises a first input port and a second input port configured to connect an external alternating current power supply, and the integrated circuit further comprises a rectifying circuit configured to convert an alternating current outputted by the external alternating current power supply into a direct current.

10. The integrated circuit according to claim 9, further comprising a voltage regulator circuit configured to regulate a first voltage outputted by the rectifying circuit to a second voltage, wherein the second voltage is supplied to the magnetic field detection circuit, the first voltage is supplied to the output control circuit, and an average value of the first voltage is greater than an average value of the second voltage.

11. The integrated circuit according to claim 1, wherein the magnetic field detection circuit comprises:
a magnetic field detection element configured to detect the external magnetic field and generate an electric signal;
a signal processing unit configured to amplify and descramble the electric signal; and
an analog-digital converting unit configured to convert the amplified and descrambled electric signal into the magnetic field detection information which is a switch-type digital signal.

12. A motor component, comprising a motor and a motor drive circuit, wherein the motor drive circuit comprises a magnetic sensor integrated circuit according to claim 1.

13. The motor component according to claim 12, wherein the motor drive circuit further comprises a bidirectional switch in series with the motor between two terminals of an external alternating current power supply, and the output port of the magnetic sensor integrated circuit is connected to a control terminal of the bidirectional switch.

14. The motor component according to claim 13, wherein the motor comprises a stator and a permanent magnet rotor, and the stator comprises a stator core and a single-phase winding wound on the stator core.

15. The motor component according to claim 14, wherein the motor component further comprises a buck regulator configured to lower a voltage of the alternating current power supply and provide the lowered voltage to the magnetic sensor integrated circuit.

16. The motor component according to claim 14, wherein the output control circuit is configured to turn on the bidirectional switch in a case that the alternating current power supply is in a positive half-cycle and a polarity of magnetic field of the permanent magnet rotor detected by the magnetic field detection circuit is a first polarity, or in a case that the alternating current power supply is in a negative half-cycle and the polarity of magnetic field of the permanent magnet rotor detected by the magnetic field detection circuit is a second polarity reverse to the first polarity, and is configured to turn off the bidirectional switch in a case that the alternating current power supply is in a negative half-cycle and the polarity of magnetic field of the permanent magnet rotor is the first polarity, or in a case that the alternating current power supply is in a positive half-cycle and the polarity of magnetic field of the permanent magnet rotor is the second polarity.

17. The motor component according to claim 16, wherein the output control circuit is configured to control a current to flow from the integrated circuit to the bidirectional switch in a case that a signal outputted by the alternating current power supply is in a positive half-cycle and the polarity of magnetic field of the permanent magnet rotor detected by the magnetic field detection circuit is the first polarity, and control a current to flow from the bidirectional switch to the integrated circuit in a case that the signal outputted by the alternating current power supply is in a negative half-cycle and the polarity of magnetic field of the permanent magnet rotor detected by the magnetic field detection circuit is the second polarity reverse to the first polarity.

18. An application apparatus, comprising a motor component according to claim 12.

19. The application apparatus according to claim 18, wherein the application apparatus is a pump, a fan, a household appliance or a vehicle.

20. The integrated circuit according to claim 1, wherein a voltage reducing circuit is coupled with the integrated circuit, when the controllable bidirectional AC switch is conductive, the voltage reducing circuit is short circuited.

* * * * *